United States Patent
Zhang et al.

(10) Patent No.: US 10,871,768 B2
(45) Date of Patent: Dec. 22, 2020

(54) APPARATUS, DEVICE AND COMPUTER IMPLEMENTED METHOD FOR AUTOMATIC GENERATION OF SCADA SLAVE INTERFACE

(71) Applicant: WÄRTSILÄ NORTH AMERICA, INC., Herndon, VA (US)

(72) Inventors: Sen Zhang, Herndon, VA (US); Murat Bayraktar, Herndon, VA (US); Nikolai Teleguine, Herndon, VA (US)

(73) Assignee: WÄRTSILÄ NORTH AMERICA, INC., Herndon, VA (US)

(*) Notice: Subject to any disclaimer, the term of this patent is extended or adjusted under 35 U.S.C. 154(b) by 141 days.

(21) Appl. No.: 16/163,952

(22) Filed: Oct. 18, 2018

(65) Prior Publication Data

US 2020/0125076 A1 Apr. 23, 2020

(51) Int. Cl.
G05B 19/418 (2006.01)
G01R 19/25 (2006.01)
(Continued)

(52) U.S. Cl.
CPC ..... *G05B 19/4186* (2013.01); *G01R 19/2513* (2013.01); *G05B 19/4183* (2013.01);
(Continued)

(58) Field of Classification Search
CPC .. G05B 19/07; G05B 19/0405; G05B 19/408; G05B 19/418; G05B 19/4186;
(Continued)

(56) References Cited

U.S. PATENT DOCUMENTS 6,477,434 B1 * 11/2002 Wewalaarachchi .. G05B 19/418
700/17
6,957,110 B2 * 10/2005 Wewalaarachchi .... G05B 15/02
700/17
(Continued)

FOREIGN PATENT DOCUMENTS

EP 2633433 B1 4/2015

OTHER PUBLICATIONS

International Search Report and Written Opinion of the International Searching Authority (Forms PCT/ISA/220, PCT/ISA/210 and PCT/ISA/237) dated Jan. 13, 2020, by the U.S. Patent and Trademark Office International Searching Authority in corresponding International Application No. PCT/US2019/56731. (9 pages).

*Primary Examiner* — M. N. Von Buhr
(74) *Attorney, Agent, or Firm* — Buchanan Ingersoll & Rooney PC

(57) ABSTRACT

A computer implemented method at an energy management system (EMS) controller apparatus for automatic generation of a SCADA (supervisory control and data acquisition) slave interface for an energy management system (EMS), includes storing a SCADA configuration file mapping SCADA data points to EMS data objects; providing the EMS data objects coded in statically typed programming language; providing site configuration information of the energy management system (EMS); scanning, by an object access framework (OAF), EMS data objects with EMS annotations and combining them with the site configuration information to generate an object binding repository (OBR); and compiling the SCADA configuration file to combine the SCADA data points mapping with the object binding repository to generate SCADA bindings information as part of the SCADA slave interface for the energy management system (EMS).

18 Claims, 5 Drawing Sheets

(51) Int. Cl.
*G06F 9/445* (2018.01)
*G06Q 50/06* (2012.01)

(52) U.S. Cl.
CPC ......... *G06F 9/44505* (2013.01); *G06Q 50/06* (2013.01); *G05B 2219/24215* (2013.01)

(58) Field of Classification Search
CPC ............... G05B 19/4183; G05B 15/02; G05B 2219/24215; G05B 2219/2639; G06F 9/44505; G01R 19/2513; G06Q 50/06; G06Q 10/0631
See application file for complete search history.

(56) References Cited

U.S. PATENT DOCUMENTS

| | | | |
|---|---|---|---|
| 8,365,005 B2 | 1/2013 | Bengtson et al. | |
| 10,268,611 B2* | 4/2019 | Xiao | G05B 19/0426 |
| 2012/0029720 A1 | 2/2012 | Cherian et al. | |
| 2013/0282144 A1* | 10/2013 | Cabello Medina | H04L 65/1016 700/9 |
| 2015/0073608 A1 | 3/2015 | Ippolito et al. | |
| 2017/0115645 A1* | 4/2017 | Merritt | G05B 19/4185 |

* cited by examiner

APPARATUS, DEVICE AND COMPUTER IMPLEMENTED METHOD FOR AUTOMATIC GENERATION OF SCADA SLAVE INTERFACE

TECHNICAL FIELD

The present application generally relates to an apparatus, a device, a method and software code for controlling a power plant system, wherein energy resources are installed. The energy resources may comprise, for example, engines, renewables (wind, solar), and energy storage systems. The present application further relates to a method, an apparatus and software code for automatic generation of SCADA (Supervisory Control And Data Acquisition) slave interface for an energy management system (EMS).

BRIEF DESCRIPTION OF RELATED DEVELOPMENTS

This section illustrates useful background information without admission of any technique described herein representative of the state of the art.

Modern distributed energy generations, renewable power generations and energy storage systems are fundamentally changing the way the power is generated, distributed and consumed. Desired systems should accelerate deployment, reduce costs and risks associated with installing the above systems. A distributed energy platform may be bundled with the advanced software controls to optimize savings, aggregate distributed energy resources, fortify grid resiliency and reliability and integrate renewables, for example.

Delivery of stable power with unsurpassed performance and profitability with system modularity and intelligent control and data management increase the challenges even further.

One traditional approach for managing energy assets is to deploy a plant controller that interacts with the equipment. For an energy storage system, the controller interacts with a power control system (PCS) and a battery management system (BMS). Known systems may also utilize a software-based controller.

SCADA (Supervisory Control And Data Acquisition) is a generic industry term for monitoring and control interfaces to industrial system. An Energy Management System (EMS) is typically supervised by customer's client application via one of the SCADA protocols (e.g. DNP3, Modbus) to conduct system monitoring and control. Each customer and each power plant system may have their own SCADA data needs.

Thus, an easy to set-up, accurate, and highly functional and reliable solution is needed to provide improved SCADA slave interface for an EMS system.

SUMMARY

According to a first example aspect of the disclosed embodiments there is provided a computer implemented method at an energy management system (EMS) controller apparatus for automatic generation of a SCADA (Supervisory Control And Data Acquisition) slave interface for an energy management system (EMS), comprising:

storing a SCADA configuration file, the SCADA configuration file including a point map mapping SCADA data points to EMS data objects, wherein the point map is configured to define the EMS data objects accessible via the SCADA slave interface using the SCADA data points;

providing the EMS data objects coded in statically typed programming language, wherein each EMS data object comprises entity properties associated using EMS annotations;

providing site configuration information of the energy management system (EMS);

scanning, by an object access framework (OAF), EMS data objects with EMS annotations and combining them with the site configuration information to generate an object binding repository (OBR); and compiling, by a SCADA binding framework, the SCADA configuration file to combine the SCADA data points mapping with the object binding repository (OBR) to generate communication protocol specific SCADA bindings information configured to form a part of the SCADA slave interface for the energy management system (EMS).

In an embodiment, the method further comprises:

receiving a data request from a SCADA client at the SCADA slave interface;

determining, by an EMS SCADA protocol library layer, a SCADA protocol of the data request;

generating a service call to a points bridge layer in response to the determined SCADA protocol; and converting the service call to an EMS data object call for a SCADA bindings layer.

In an embodiment, the method further comprises:

connecting the EMS data object call, by the SCADA bindings layer, to at least one method call to an executable EMS data object coded in a statically typed programming language.

In an embodiment, the executable EMS data object call is connected via an object access framework (OAF) layer to an EMS object layer.

In an embodiment, the EMS data object call is connected to at least one EMS device or EMS service of the EMS object layer.

In an embodiment, the object access framework (OAF) layer is configured to provide binding and metadata.

In an embodiment, the EMS data object comprises at least one of the following:

an energy resource equipment;
an energy storage system (ESS);
a measurement device;
a software logic status; and
an operation setpoint.

In an embodiment, the SCADA data point comprises at least one of the following received information:

equipment status data;
state of charge (SOC) of an energy storage system;
measurement readings;
real power or reactive power status information;
temperature information; and
fault status information.

In an embodiment, the SCADA data point comprises at least one of the following transmitted information:

start command;
stop command;
reset command; and
update setpoint command.

In an embodiment, the SCADA slave interface is configured to operate using at least one of the following protocols:

DNP3; and
Modbus.

In an embodiment, the SCADA data point is configured to comprise:

a register in Modbus; or
a point or an object in DNP3.

In an embodiment, the EMS annotations comprising at least one of the following:
indication which EMS data objects are part of public API; and
metadata.

In an embodiment, the metadata comprising at least one of the following:
units of measurement; and
human-readable descriptions.

In an embodiment, the SCADA configuration file comprises at least one of the following protocol information:
data type used;
encoding information; and
point positions and their mapping to physical EMS device properties.

In an embodiment, the SCADA slave interface for an energy management system (EMS) comprises at least one of:
a first slave interface for a remote terminal unit (RTU) for controlling the EMS; and
a second slave interface for a local access for status monitoring and support.

In an embodiment, at the energy management system (EMS) controller apparatus, a HTTPS Web based human-machine interface is configured to control the EMS system remotely using Web browsers.

According to a second example aspect of the disclosed embodiments there is provided a controller apparatus for an energy management system (EMS) for automatic generation of SCADA slave interface, the controller apparatus comprising:
a communication interface configured to transceive information with a SCADA client and EMS data objects;
at least one processor; and
at least one memory including computer program code;
the at least one memory and the computer program code configured to, with the at least one processor, cause the apparatus to:
store a SCADA configuration file, the configuration file including a point map mapping SCADA data points to EMS data objects, wherein the point map is configured to define the EMS data objects accessible via the SCADA slave interface using the SCADA data points;
provide the EMS data objects coded in statically typed programming language, wherein each EMS data object comprises entity properties associated using EMS annotations;
provide site configuration information of the energy management system (EMS);
scan, by an object access framework (OAF), EMS data objects with EMS annotations and combining them with the site configuration information to generate an object binding repository (OBR); and
compile, by a SCADA binding framework, the SCADA configuration file to combine the SCADA data points mapping with the object binding repository to generate SCADA bindings information configured to form a part of the SCADA slave interface for the energy management system (EMS).

According to a third example aspect of the disclosed embodiments there is provided a computer program embodied on a computer readable non-transitory medium comprising computer executable program code, which code, when executed by at least one processor of an apparatus, causes the apparatus to:
store a SCADA configuration file, the configuration file including a point map mapping SCADA data points to EMS data objects, wherein the point map is configured to define the EMS data objects accessible via the SCADA slave interface using the SCADA data points;
provide the EMS data objects coded in statically typed programming language, wherein each EMS data object comprises entity properties associated using EMS annotations; provide site configuration information of the energy management system (EMS);
scan, by an object access framework (OAF), EMS data objects with EMS annotations and combining them with the site configuration information to generate an object binding repository (OBR); and
compile, by a SCADA binding framework, the SCADA configuration file to combine the SCADA data points mapping with the object binding repository to generate SCADA bindings information configured to form a part of the SCADA slave interface for the energy management system (EMS).

Different non-binding example aspects and embodiments of the disclosure have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well.

BRIEF DESCRIPTION OF THE DRAWINGS

The aspects of the disclosed embodiments will be described, by way of example only, with reference to the accompanying drawings, in which.

DETAILED DESCRIPTION

In the following description, like numbers denote like elements.

Figure 1:
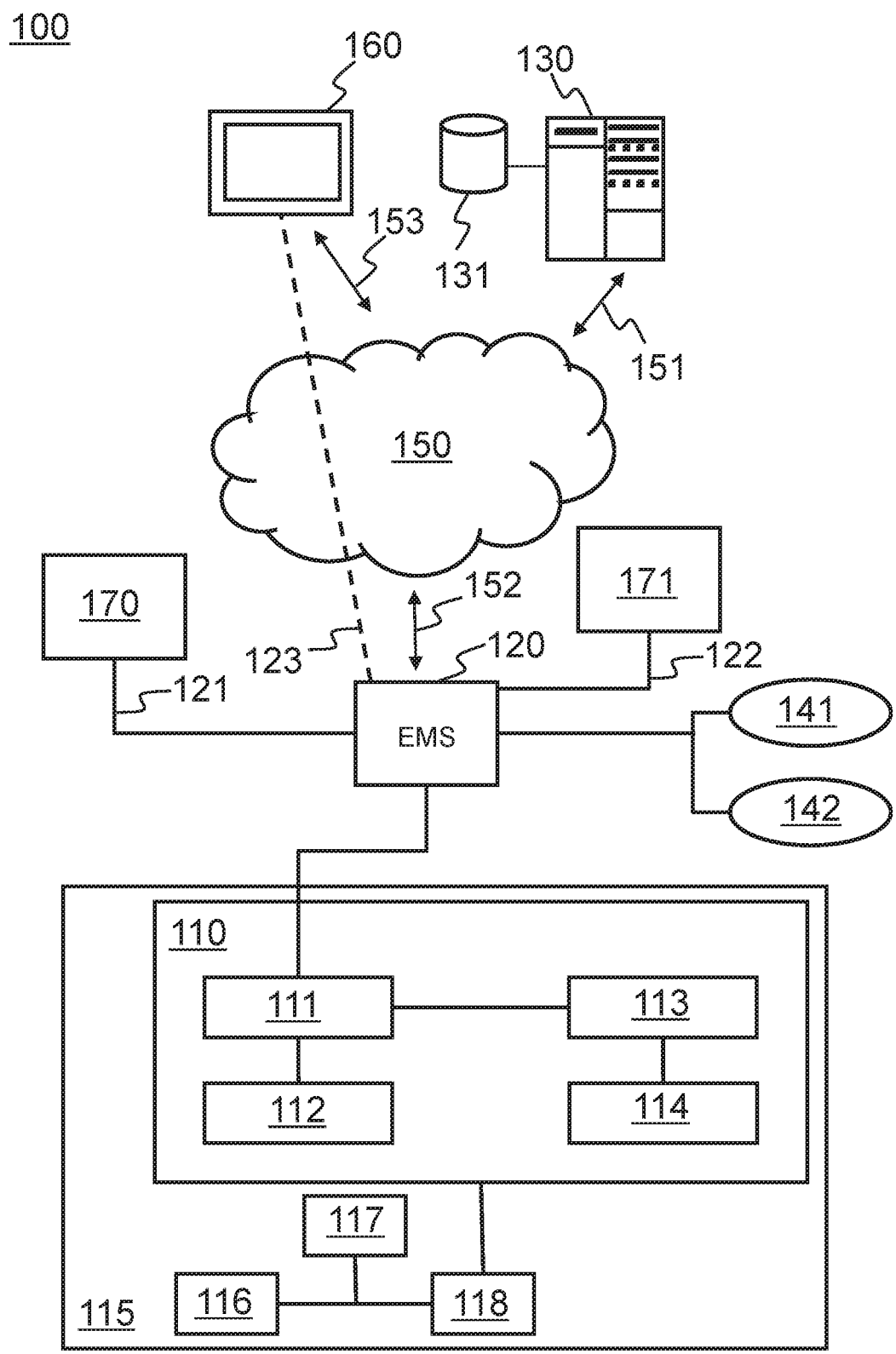
FIG. 1 shows a schematic picture of a system according to an aspect of the disclosed embodiments.

FIG. 1 shows a schematic picture of a system 100 according to an example embodiment.

An Energy Storage System (ESS) 110 may be installed on-site at a power plant wherein energy equipment such as an energy storage system, are installed. Operation logic is implemented by an Energy Management System (EMS) Site Controller 120. Key communication interfaces by the EMS Site Controller 120 may be required for an operator to monitor the system and conduct operations.

The Energy Storage System (ESS) 110 may comprise a plurality of ESS units 111-112, 113-114 and each ESS unit 111-112, 113-114 may have own Power Conversion System (PCS) 111, 113 and associated batteries 112, 114, respectively. The EMS Site Controller 120 communicates with PCS 111 that aggregates both ESS units 111-114 into a single Site ESS 110 with pre-defined ratings. The ratings may be, for example, 2 MW (Rated P), 2 MVAR (Rated Q) and 10 MWh (Nominal Energy Capacity). No matter there are two ESS units illustrated in FIG. 1, the number may vary depending on the storage capacity needed.

The EMS Site Controller 120 may have a plurality of SCADA interfaces 121, 122.

SCADA (Supervisory Control And Data Acquisition) is a generic industry term for monitoring and control interfaces to industrial equipment. An EMS system 100 is typically monitored by a system operator (e.g. electric utility), and they use some type of SCADA solution to interact with the EMS Site Controller 120 and related devices and/or services 110, 141, 142, as well as with other, legacy systems, so the EMS Site Controller 120 needs to speak the same language. SCADA typically uses one of several industrial protocols. For SCADA purposes, EMS system 100 may use, for example, two protocols—Modbus and DNP3.

At a high level, SCADA exposes a set of control points which can be read from to obtain current system parameters (power, state of charge, temperature, fault status) and written to (start, stop, reset, update setpoints). Control points in Modbus are called registers, and in DNP3, points or objects. Each point or register is mapped to a property or method of one of EMS entities (an ESS 110, a meter 141, a PCS 111,113, a service 142 status or operation setpoint etc).

In FIG. 1, there are two slave interfaces 121, 122 illustrated. As an example, we may assume that both of them are DNP3-protocol interfaces for remote terminal units (RTU), for example.

A remote terminal unit (RTU) is a microprocessor-controlled electronic device that interfaces objects in the physical world to a distributed control system or SCADA (Supervisory Control And Data Acquisition) system by transmitting telemetry data to a master system, and by using messages from the master supervisory system to control connected objects. Other terms that may be used for RTU is remote telemetry unit or remote tele control unit.

For example, first SCADA (DNP3) slave interface 121 may be configured for a generation RTU 170 (e.g. electric utility) to control ESS operations and conduct ancillary service (e.g. frequency regulation) signal exchanges, for example.

For example, second SCADA (DNP3) slave interface 122 may be configured for a distribution RTU 171 (e.g. local operation team of the electric utility) to pull system information as part of circuit status monitoring and islanding support, for example.

Additionally, the EMS Site Controller 120 may have a HTTPS Web based Human Machine Interface (HMI) 123 for operator engineers to conduct system remotely using Web browsers, for example.

In an embodiment, the EMS Site Controller 120 is configured to be connected to at least one meter 141, 142. Site meter 141, for example, may be configured to provide site real power read (MW) or site reactive power read (MVAR). Auxiliary meter 142, for example, may be configured to provide auxiliary power read (MW), for example. The generation RTU 170 may retrieve the follow feedback signals from the EMS Site Controller 120 and send them back to some external ancillary service system, for example.

The number of RTU's 170-171 and associated slave interfaces (and used protocols) 121, 122 may vary depending on the implementation and the customer.

The system 100 may comprise a power plant subsystem 115 and a controller apparatus (EMS) 120 as separate entities, where the controller apparatus 120 may be remote to the subsystem 115 or the subsystem 115 and the control apparatus 120 may be arranged on the same sub-system 115, 120.

A power plant subsystem 115 may comprise a photovoltaic power source 116 to provide photovoltaic DC power to a photovoltaic DC bus, an inverter 117 comprising a direct current (DC) power input operationally connected to the photovoltaic DC bus to receive photovoltaic DC power, and an alternating current (AC) power output for supplying AC power to an AC system.

The power plant subsystem 115 may further comprise a DC-to-DC converter 118 comprising a first direct current (DC) port to be operationally connected to the photovoltaic DC bus in parallel with the photovoltaic power source 116, and an energy storage 110 operationally connected to a second direct current (DC) port of the DC-to-DC converter 118.

The system 100 may further comprise an energy storage manager (e.g. battery management system, BMS) operationally connected to the energy storage 110 for monitoring and controlling the energy storage, BMS may be arranged, for example, in block 111.

The energy storage system (ESS) 110 or the energy storage 112, 114 illustrated in FIG. 1 may be defined to include all forms of stationary energy storages, including battery storages, such as Li-ion and other electrochemical and flow batteries, for example.

In an embodiment, the (EMS) controller apparatus 120 is configured to communicate with various devices and elements in the sub-system 115 and send start/stop commands, send set points and obtain status and readings, for example.

In an embodiment, the (EMS) controller apparatus 120 is configured to communicate with the battery management system (BMS) over a communication path. The (EMS) controller apparatus 120 is configured to send commands for BMS to connect/disconnect battery strings to/from the DC bus, obtain DC current limits in both charge and discharge directions in real time from the BMS, obtain battery status readings such as DC voltages or state of charge from the BMS.

In an embodiment, the (EMS) controller apparatus 120 may comprise means for generating, processing and transceiving power plant system related data through a communication interface, for example. The apparatus 120 is capable of downloading and locally executing software program code. The software program code may be a client application of a service whose possible server application is running on a server apparatus 130, 131 of the system 100. Any of the sub-system 115 devices may comprise a capturing device, such a sensor device, for providing power plant related signals. The sensor device may comprise a sensor, a microphone or a camera, for example. The camera may also be used to provide video data and a microphone may be used for providing audio data, for example.

The apparatus 120 is configured to be connectable to a public network 150, such as Internet, over connection 152. The connection 152 may be arranged directly via local connection or via a wireless communication network over a wireless connection, for example. The wireless connection may comprise a mobile cellular network, a satellite network or a wireless local area network (WLAN), for example. The wireless communication network may be connected to a public data communication network 150, for example the Internet, over a data connection. The apparatus 120 may be configured to be connectable to the public data communication network 150, for example the Internet, directly over a data connection that may comprise a fixed or wireless mobile broadband access.

The sub-system 115, or any of the devices within the sub-system may be configured to be connectable to a public network 150, such as Internet, over separate connection.

The apparatus 120 and its client application may allow the apparatus 120 to log into a power plant data service run on a server 130, for example.

Real-time interaction may be provided between the apparatus 120, the sub-system 110 and the server 130 to collaborate for power plant system data over a network 150. Real-time interaction may also be provided between the apparatus 120 and a remote user device 160 to collaborate for data over a network 150.

The user of the apparatus 120 or the remote user device 160 may need to be logged in with user credentials to a chosen service of the network server 130.

In an embodiment, a device of the sub-system 115 may comprise a sensor device configured to be comprised by or connectable to the apparatus 120 over a local connection or to a server 130 over the network 150. The local connection may comprise a wired connection or a wireless connection. The wireless connection may comprise acoustic connection, Bluetooth™, Radio Frequency Identification (RF-ID), Zig-Bee, or wireless local area network (WLAN), for example. Near field communication (NFC) may be used for sensor device identification between the sensor device and any other device, for example. Data provided by at least one sensor device may be used as an input to the control algorithm and software within the (EMS) control apparatus 120. The input may be used for providing, for example, environmental data, such as temperature information, brightness information, HVAC information, and smoke detection information, for example.

A sensor device arranged to any device of the sub-system 115 may also be connected directly to the public network 150, such as Internet, via direct local connection or via a wireless cellular network connection.

In an embodiment, the system 100 may comprise a server apparatus 130, which comprises a storage device 131 for storing service data, service metrics and subscriber information, over data connection 151. The service data may comprise configuration data; account creation data; sensor data; sensor ID's; control data, history data, user input data; real-time collaboration data; predefined settings; and attribute data, for example.

In an embodiment, a proprietary application in the apparatus 120 may be a client application of a service whose server application is running on the server apparatus 130 of the system 100.

The proprietary application of the apparatus 120 may receive input data from the sub-system 115, 141, 142 and provide the output data. The input data may comprise data captured by a sensor device arranged to any device of the sub-system 115 or data generated directly by any device or service.

In an embodiment, configuration information or application download information for any apparatus may be automatically downloaded and configured by the server 130. Thus, the user of the devices may not need to do any initialization or configuration for the service. The system server 130 may also take care of account creation process for the service, such as sensors, devices, apparatuses and users.

In an embodiment, the association of the devices can be one-time or stored persistently on any of the devices or the server 130.

In an embodiment, authentication of any device or apparatus 120 on a system server 130 may utilize hardware or SIM credentials, such as International Mobile Equipment Identity (IMEI) or International Mobile Subscriber Identity (IMSI). Any device or apparatus 120 may transmit authentication information comprising IMEI and/or IMSI, for example, to the system server 130. The system server 130 authenticates the device by comparing the received authentication information to authentication information of registered users stored at the system server database 131, for example. Such authentication information may be used for pairing the devices and/or apparatuses to generate association between them for a power plant related data connection.

In an embodiment, a service web application may be used for configuration of a system. The service web application may be run on any user device, admin device, or a remote control device 160, such as a personal computer connected over a connection 153 to a public data network, such as Internet 150, for example. The control apparatus 160 may also be connected locally to the apparatus 120 over a local connection and utilize the network connections of the apparatus 120 for configuration purposes. The service web application of the control apparatus may provide searching/adding instruments, determining attributes, device setup and configuration, for example. The service web application of the control apparatus 160 may be a general configuration tool for tasks being too complex to be performed on the user interface of the apparatus 120, for example.

In an embodiment, a remote control apparatus 160 may be authenticated and configuration data sent from the control apparatus 160 to the system server 130, 131 wherein configuration settings may be modified based on the received data. In an embodiment, the modified settings may then be sent to the apparatus 120 over the network 150 and the local connection or the wireless operator. The modified settings may also be sent to external devices correspondingly, through the apparatus 120 or directly over the network 150, for example.

In an embodiment, any sensor device may be wireless or wired.

Key challenges of developing a robust and flexible SCADA server, as part of the EMS system 100, are the following:

Project Cost. It is time consuming to write custom code to meet all customers SCADA interface requirements due to large number of data points for large energy site.

Fragility. Hand coded SCADA implementation that connect customer data with internal system objects is very fragile. Any interface changes or internal system code changes may breaker the data consistency.

Code Quality. The code quality of the SCADA interface implementation depends on project engineer's coding skills. Bugs can be hard to identify. Testing large number of data points can be cumbersome.

Figure 2:
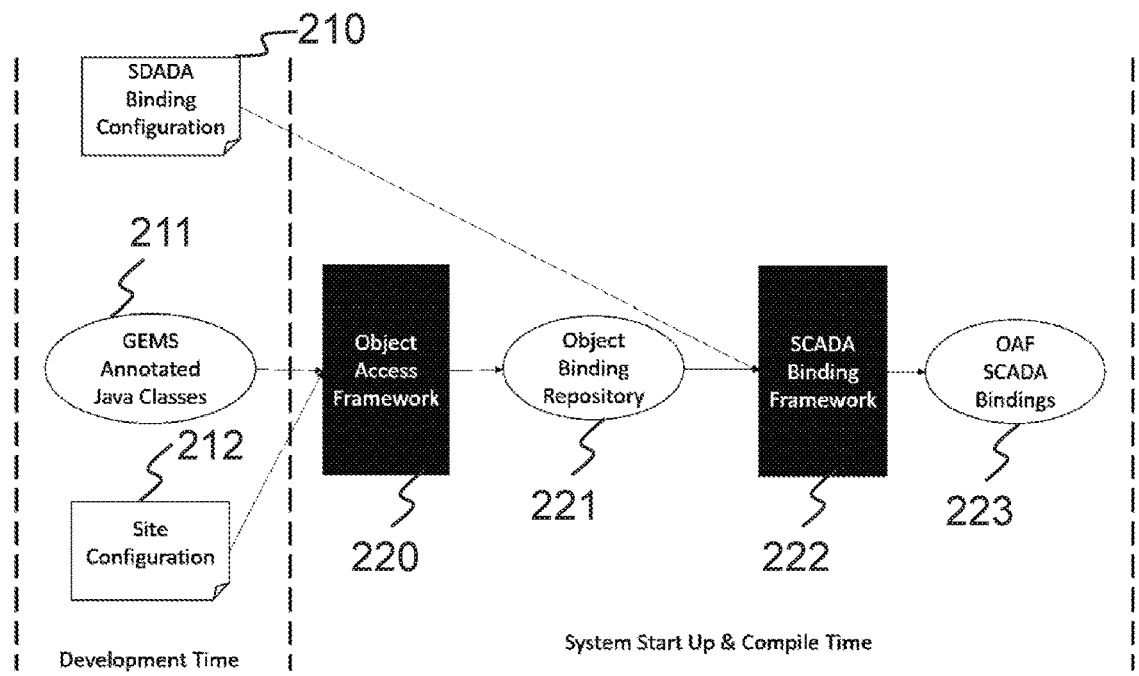
FIG. 2 illustrates how different technical components work together to automatically generate SCADA slave implementation within a system of FIG. 1 within development, system start up and compilation time, according to an aspect of the disclosed embodiments.

FIG. 2 illustrates how different technical components work together to automatically generate SCADA slave implementation in view of a system of FIG. 1 within development, system start up and compilation time, according to an aspect of the disclosed embodiments.

In an embodiment, the EMS Site Controller 120 of FIG. 1 is configured to intelligently process, generate and enable the SCADA server interface creation that minimizes custom coding.

First, SCADA Configuration Language is defined. It is a text-based markup language, such as XML, defined for a SCADA configuration file 210 that maps SCADA data points to EMS data objects. It captures protocol information such as data types, encoding information, point positions and their mapping to physical EMS device properties.

In an embodiment, the SCADA configuration file 210 defines a point map mapping SCADA data points to EMS data objects, wherein the point map is configured to define the EMS data objects accessible via the SCADA slave interface using the SCADA data points.

In an embodiment, the SCADA data point may comprise at least one of the following received information: equipment status data; state of charge (SOC) of an energy storage system; measurement readings; real power or reactive power status information; temperature information; and fault status information.

In an embodiment, the SCADA data point may comprise at least one of the following transmitted information: start command; stop command; reset command; and update setpoint command.

In an embodiment, the SCADA slave interface may be configured to operate using at least one of the following protocols: DNP3; and Modbus. The SCADA data point may be configured to comprise: a register in Modbus; or a point or an object in DNP3.

Second, EMS Annotation Library 211 coded in statically typed programming language is defined. The library of annotations can be used within programming source code to indicate physical properties the programming code captures. Due to the static type nature, the annotated information is preserved by language compiler. The annotations are used by Object Access Framework (OAF) 220 to create Object Binding Repository (OBR) 221 that acts as a dictionary that provide fast object access to device and device properties during runtime.

In an embodiment, the EMS data objects are coded in statically typed programming language, wherein each EMS data object comprises entity properties associated using EMS annotations.

Third, Object Access Framework (OAF) 220 is determined. OAF 220 is an EMS component that scans compiled executable computer code based on annotations at start up time to build Object Binding Repository 221. It is the foundation of EMS slave interface definition technology including SCADA binding.

Fourth, SCADA Binding Framework 222 is defined. It builds on the top of Object Access Framework 220 that create SCADA bindings 223 to programming objects by combining Object Binding Repository 221 with SCADA specific information.

In an embodiment, any EMS device 110-118, 141, 142 (see e.g. FIG. 1) within the EMS sub-system 115 or external to sub-system 115 but operationally connected to the EMS Site Controller 120, such as devices 141, 142, are configured to be associated with device physical properties. The physical properties are configured to be indicated within a computer code (e.g. EMS data object) of each EMS device 110-118, 141, 142 by using EMS annotations to generate EMS annotated code 211 (EMS data objects with EMS annotations). The EMS annotations become integral part of EMS code base that can be used in different sites controlled to maintain consistency. The EMS annotations may be generated and at coding phase, when the device code 211 is written, for example.

An example of the EMS annotated code, such as an EMS data object with EMS annotation, may comprise following EMS annotated code:
@EMSProperty(name="Water Temperature",
description="Water Temperature",
unit=C,
min="−40.0",
max="85.0")
double getWaterTemperature( );

At start up time, OAF 220 scans all EMS objects with annotations 211, combines them with site configuration information 212 to generate Object Binding Repository 221.

In an embodiment, the site configuration information 212 may comprise information of site devices, such site meter, PV meter and load meter, with their associated update intervals, computer network addresses (IP Address). Furthermore, the site configuration information 212 may comprise information of PCS (Power Conversion System) configuration and related computer network addresses and energy storage (battery) system configuration and related computer network addresses, for example. This configuration information describes a point map, a specification that specifies what points a particular EMS system should make available to the operator's SCADA.

Furthermore, at start up time, SCADA Binding Framework 222 compiles SCADA configuration file 210 and combines SCADA mapping with Object Binding Repository 221 to build SCADA Bindings information 223 that is configured to serve as a part of EMS SCADA slave interface 121-123 of FIG. 1.

Figure 3:
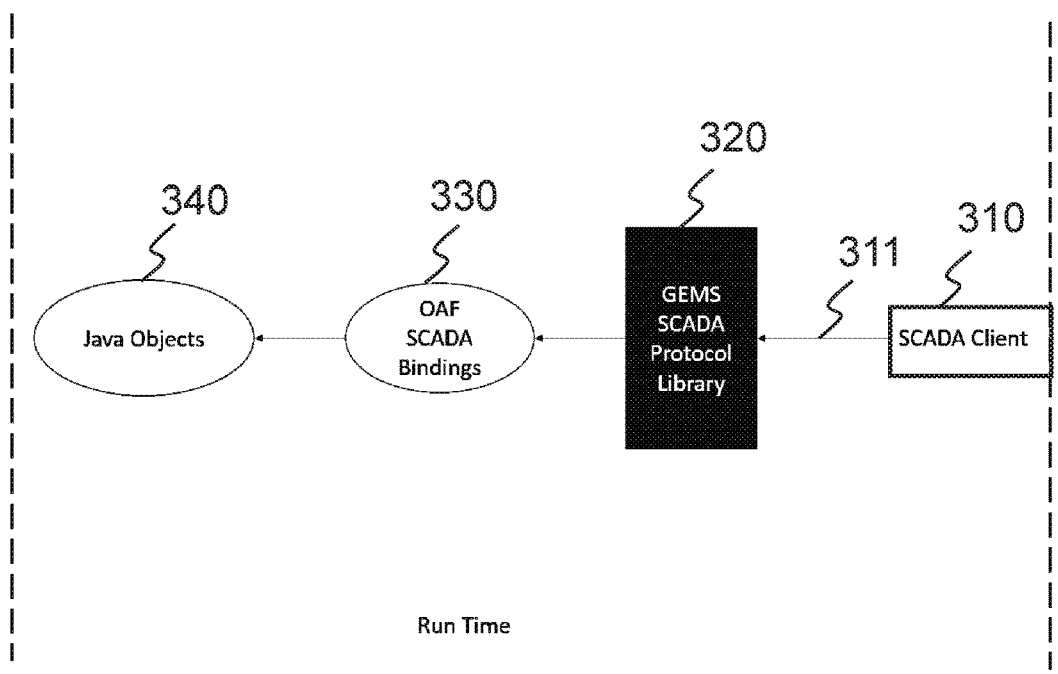
FIG. 3 illustrates how different technical components work together to automatically generate SCADA slave implementation within a system of FIG. 1 within run time, according to an aspect of the disclosed embodiments.

FIG. 3 illustrates how different technical components work together to automatically generate SCADA slave implementation within a system of FIG. 1-2 within runtime, according to an aspect of the disclosed embodiments.

At runtime, as illustrated in FIG. 3, when external SCADA client 310 (for example a device 160, 170-171 in FIG. 1) sends a data request 311 to EMS SCADA slave interface (e.g. 121-123 in FIG. 1), it is first handled by EMS SCADA protocol library 320 (e.g. DNP3 or Modbus). The request is then handed to SCADA Bindings entity 330 built during start up time (shown in FIG. 2 as 223), which in turn connect SCADA data request to object (e.g. Java) calls 340.

The above frameworks provide a plurality of advantages. First, coding time is saved. Project developer does not need to conduct any custom coding to create SCADA server that meets customer data SCADA data interface requirement. Developer only needs to create a configuration file 210 for data requirements. Second, consistency is improved. The same OAF framework 220 and Object Binding Repository 221 can be used by other external interfaces (such as interfaces 121-123, 152 of FIG. 1) such as HMI and Web Services, for example. Data consistency is provided across all interfaces. Third, flexibility is improved, SCADA interface can be modified by simply changing SCADA configuration 210 file without any code change.

In an embodiment, a data request 311 is received from a SCADA client 310 at the SCADA slave interface. An EMS SCADA protocol library layer 320 determines a SCADA protocol of the data request and generates a service call to a points bridge layer in response to the determined SCADA protocol and converts the service call to an EMS data object call for a SCADA bindings layer 330. The SCADA bindings layer 330 may then connect the EMS data object call to at least one method call to an executable EMS data object coded in a statically typed programming language 340 (e.g. Java object).

In an embodiment, the executable EMS data object call is connected via an object access framework (OAF) layer to an EMS object layer. The EMS data object call may be connected to at least one EMS device or EMS service of the EMS object layer. The object access framework (OAF) layer is configured to provide binding and metadata, for example. These interactions are illustrated later in FIG. 5, for example.

In an embodiment, the EMS data object may comprise, for example, at least one of the following: an energy resource equipment; an energy storage system (ESS); a measurement device; a software logic status; and an operation setpoint.

Figure 4:
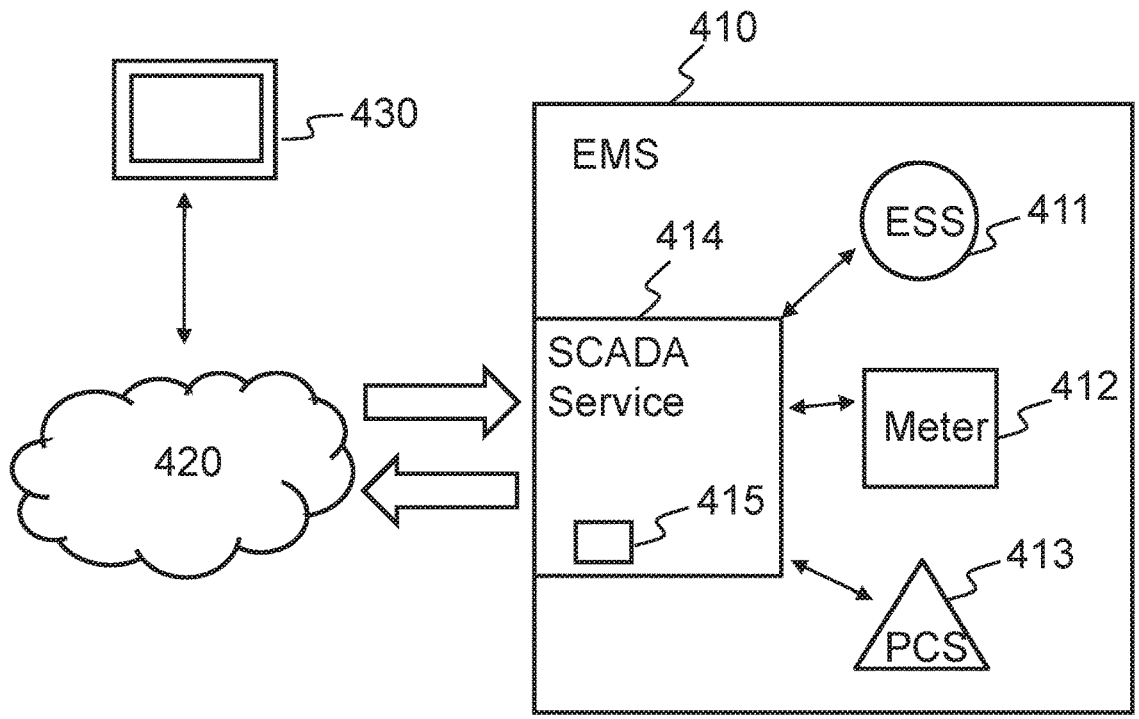
FIG. 4 presents an example view of high level SCADA service concept within EMS system, in which various embodiments of the invention may be applied.

FIG. 4 presents an example view of high-level SCADA service concept within EMS system, in which various embodiments of the invention may be applied.

SCADA (Supervisory Control And Data Acquisition) is a generic industry term for monitoring and control interfaces to industrial equipment. An EMS system 410 is typically monitored by a system operator (e.g. electric utility), and they use some type of SCADA solution 420-430 to interact with the EMS 410, as well as with other, legacy systems, so the EMS system 410 needs to communicate with the same language. SCADA typically uses one of several industrial protocols. For SCADA purposes, the EMS system 410 may support, for example, two protocols—Modbus and DNP3.

At a high level, SCADA exposes a set of control points that can be read from to obtain current system parameters (power, state of charge, temperature, fault status) and written to (start, stop, reset, update setpoints). Control points in Modbus are called registers, and in DNP3, points or objects. Each point or register is mapped to a property or method of one of EMS entity. Such entities may comprise, but are not limited to an ESS status information 411, a meter 412, or a PCS 413, a service status or operation setpoint etc.

Both DNP3 SCADA and Modbus SCADA are implemented as EMS SCADA services 414 and rely on a configuration file 415 to establish mappings between SCADA points and EMS properties. This configuration file 415 describes a point map, a specification that specifies what points a particular EMS system 410 should make available to the operators SCADA 420, 430.

To bind SCADA points to EMS properties, SCADA services 414 relies on Object Access Framework (OAF) (shown in FIG. 2 as item 220), and the OAF in turn relies on EMS annotations (shown in FIG. 2 as item 211) indicating which methods and properties are part of public API, and providing metadata such as units of measurement, human-readable descriptions, for example. Point configuration files 415 may be provided in text-based markup language, such as XML, and are parsed using EMS 410 core configuration support.

It is important to note that unless a method or property is marked with for example "EMSProperty" or "EMSCommand" annotation, it cannot be bound to, and is effectively invisible for most external interfaces. Annotations are the primary source of metadata, and points configuration file 415 provides protocol-specific details and modifies such annotation attributes as scale and units (e.g. the customer may want system power presented in kilowatts and not in watts). SCADA service 414 creates a binding for each point, combining data from the OAF and protocol-specific details provided by the point configuration file 415. Bindings may also contain protocol-specific attributes.

Figure 5:
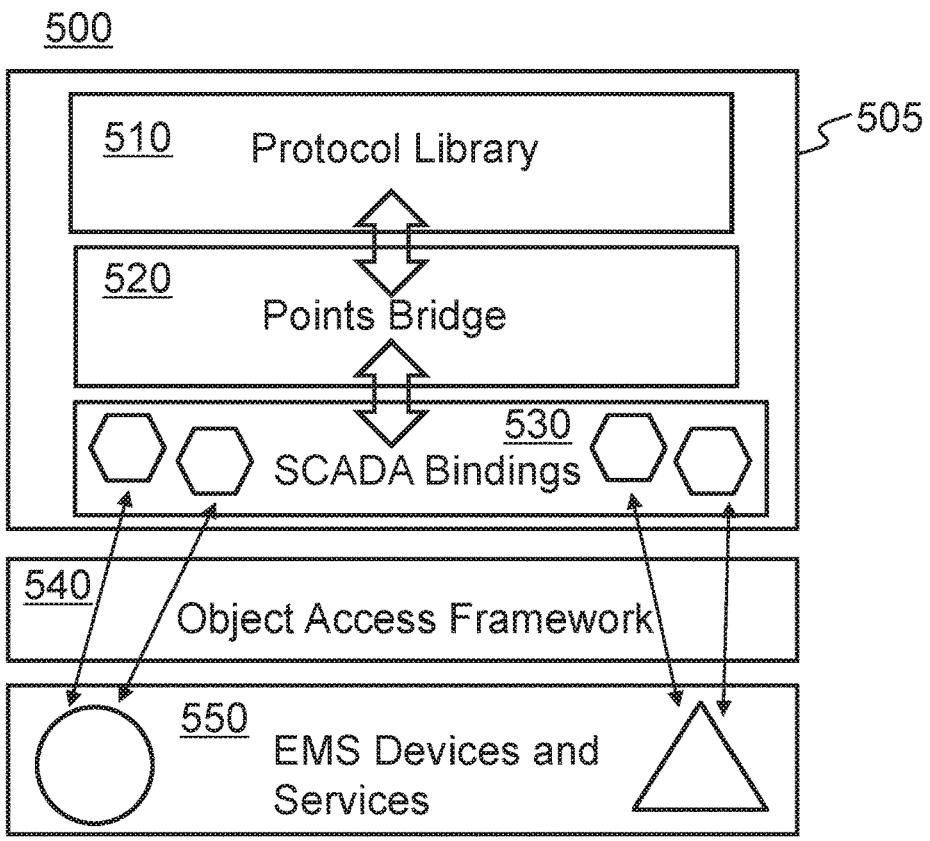
FIG. 5 presents a schematic drawing of a layer model, in which various embodiments of the invention may be applied.

FIG. 5 presents a schematic drawing of a layer model 500, in which various embodiments of the invention may be applied.

Architecturally, DNP3 and Modbus SCADA services are very similar. Once a SCADA service 505 is started with provided point configuration file (like configuration 415 in FIG. 4), it listens and responds on a specified port. A protocol-specific library 510 handles packet-level encoding and decoding, and forwards read and write requests to a user layer 520 (Points Bridge in FIG. 5). The user layer 520 looks up which binding corresponds to the point addressed by the request, and reads or sets the value.

The protocol library 510 layer handles wire-level protocol communication, including addressing, packed encoding and decoding, and error detection. It hides these low-level details from other tiers of the system. The protocol library 510 calls several well-defined methods in points bridge layer 520 in response to incoming read and write requests.

Points bridge layer 520 receives the requests from protocol library layer 510 and translates them into method calls against EMS object model (devices and services within the EMS system). The points bridge layer 520 implements higher-level protocol logic and semantic conversion between SCADA protocol data formats and command types and the used EMS model.

SCADA bindings layer 530 defines bindings that are protocol-specific extensions of Object Access Framework OAF bindings, and carry attributes needed for particular feature of SCADA protocol. These include point addresses, protocol data types, scaling factors and unit conversion specifications. They also allow to overwrite standard OAF attributes if necessary.

OAF layer 540 provides bindings and stores metadata. Bindings are objects representing individual elements—objects, their attributes and commands—of EMS API. The bindings store metadata (data types, human-readable descriptions, value ranges etc.) and facilitate access and look-up.

EMS service layer 550 provides EMS system services, such as PCS, ESS and meter as shown in FIG. 4.

There are a number of protocol-specific details in point configuration files (such as configuration file 210 in FIG. 2), but conceptually they are similar. The configuration file 210 (FIG. 2) may be understood to relate to actions of layer 530 of FIG. 5. Below are examples of simple but complete configuration files for DNP3 and Modbus SCADA interfaces, SCADA points are, as an example, illustrated as bolded and EMS properties as underlined.

---

DNP3 Example:
<DNP3>
<Points>
<AnalogInput name="ESS Real Power B1_UGMW_GEN7" binding="SiteEss.getRealPower" dnp3type="G30V5" index="0" unit="kW" scale="0.1" eventClass="1" deadband="0.01"/>
<AnalogInput name="ESS ReactivePower B1_UGMV_GEN-7" binding="SiteEss.getReactivePower" dnp3type="G30V5" index="1" unit="kVAr" scale="0.1" eventClass="1" deadband="0.01"/>
<AnalogOutput name="ESS Real Power SetPoint" binding="SiteEss.commandRealPowerSignal" index="0" unit="kW"/>
<BinaryInput name="ESS Running B1_UCON_GENE" binding="SiteEss.isEssRunning" index="0" eventClass="1"/>
<BinaryInput name="ESS Remote Power B1_ISO_UASW_RIGX" binding="SiteEss.isEssPowerRemotelyControlled" index="5" eventClass="1"/>

-continued

```
</Points>
</DNP3>
Modbus Example:
<ModbusMap>
<Registers>
<!-- status - booleans -->
<Input binding='SiteEss.hasCriticalFault' index='0' unsigned='true' />
<Input binding='SiteEss.isParticipating' index='1' unsigned='true' />
<Input binding='SiteEss.isLocked' index='2' unsigned='true' />
<Input binding='SiteEss.isRunning' index='3' unsigned='true' />
<!-- status - analog values -->
<Input binding='SiteEss.realPower' index='4' scale='0.1' />
<Input binding='SiteEss.getMaxP' index='5' scale='0.1'
unsigned='true' />
<input binding='SiteEss.getAverageSoc' index='6' scale='10'
unsigned='true' />
<Input binding='SiteEss.getDcVoltage' index='7' scale='10'
unsigned='true' />
<Input binding='SiteEss.getDcPower' index='8' scale='0.1'
unsigned='false' />
<Input binding='SiteEss.getAcChargePowerLimit' index='9' scale='0.1'
unsigned='true' />
<Input binding='SiteEss.getAcDischargePowerLimit' index='10'
scale='0.1' unsigned='true' />
<!-- control - analog -->
<Holding binding='SiteEss.setRealPowerSignal'
</Registers>
</ModbusMap>
```

Figure 6:
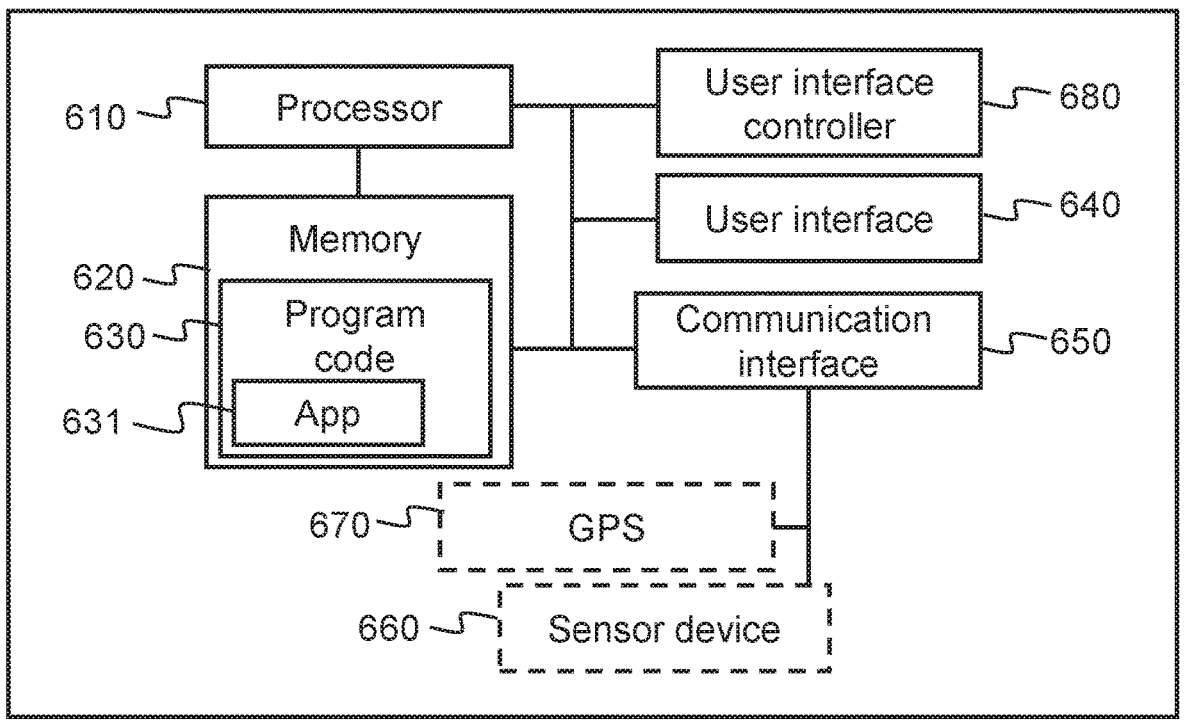
FIG. 6 presents an example block diagram of a control apparatus (EMS) in which various embodiments of the invention may be applied.

FIG. 6 presents an example block diagram of a control apparatus (EMS) 120 in which various embodiments of the invention may be applied. The apparatus 120 may be a user equipment (UE), user device or apparatus, such as a remote computer system.

The general structure of the apparatus 120 comprises a user interface 640, a communication interface 650, a processor 610, and a memory 620 coupled to the processor 610. The apparatus 120 further comprises software 630 stored in the memory 620 and operable to be loaded into and executed in the processor 610. The software 630 may comprise one or more software modules and can be in the form of a computer program product.

The apparatus 120 may also optionally comprise a satellite positioning device (GPS) 670, a capturing device (such as sensor device) 660 for capturing local activity data and/or current environmental data. The apparatus 120 may further comprise a user interface controller 680.

The processor 610 may be, e.g., a central processing unit (CPU), a microprocessor, a digital signal processor (DSP), a graphics processing unit, or the like. FIG. 6 shows one processor 610, but the apparatus 120 may comprise a plurality of processors.

The memory 620 may be for example a non-volatile or a volatile memory, such as a read-only memory (ROM), a programmable read-only memory (PROM), erasable programmable read-only memory (EPROM), a random-access memory (RAM), a flash memory, a data disk, an optical storage, a magnetic storage, a smart card, or the like. The apparatus 120 may comprise a plurality of memories. The memory 620 may be constructed as a part of the apparatus 120 or it may be inserted into a slot, port, or the like of the apparatus 120 by a user. The memory 620 may serve the sole purpose of storing data, or it may be constructed as a part of an apparatus serving other purposes, such as processing data. A proprietary data application (client control application) 631, control system data and environmental data may be stored to the memory 620.

The user interface controller 680 may comprise circuitry for receiving input from a user of the apparatus 120, e.g., via a keyboard, graphical user interface shown on the display of the user interfaces 640 of the apparatus 120, speech recognition circuitry, or an accessory device, such as a headset, and for providing output to the user via, e.g., a graphical user interface or a loudspeaker.

The satellite positioning device 670 is configured to provide location information. Such information may comprise, for example, position coordinates, speed, direction of movement, time (GPS time) and altitude information.

The communication interface module 650 implements at least part of data transmission. The communication interface module 650 may comprise, e.g., a wireless or a wired interface module. The wireless interface may comprise such as a WLAN, Bluetooth, infrared (IR), radio frequency identification (RF ID), GSM/GPIRS, CDMA, WCDMA, LTE (Long Term Evolution) or 5G radio module. The wired interface may comprise such as universal serial bus (USB) or National Marine Electronics Association (NMEA) 0183/2000 standard for example. The communication interface module 650 may be integrated into the apparatus 120, or into an adapter, card or the like that may be inserted into a suitable slot or port of the apparatus 120. The communication interface module 650 may support one radio interface technology or a plurality of technologies. The apparatus 120 may comprise a plurality of communication interface modules 650.

A skilled person appreciates that in addition to the elements shown in FIG. 6, the apparatus 120 may comprise other elements, such as microphones, extra displays, as well as additional circuitry such as input/output (I/O) circuitry, memory chips, application-specific integrated circuits (ASIC), processing circuitry for specific purposes such as source coding/decoding circuitry, channel coding/decoding circuitry, ciphering/deciphering circuitry, and the like. Additionally, the apparatus 120 may comprise a disposable or rechargeable battery (not shown) for powering when external power if external power supply is not available.

In an embodiment, the apparatus 120 comprises speech recognition means. Using these means, a pre-defined phrase may be recognized from the speech and translated into control information for the apparatus 120, for example.

The satellite positioning device 670 and the capturing device 660 may be configured to be comprised by the apparatus 120 or connected as separate devices to the apparatus 120. In case the satellite positioning device 670 and the capturing device 660 are comprised in the apparatus 120 they may be connected to the apparatus 120 using an internal bus of the apparatus 120. In case the satellite positioning device 670 and the capturing device 660 are external devices connected to the apparatus 120 they may be connected to the apparatus 120 using communication interface 650 of the apparatus 120 or using the internal bus.

Figure 7:
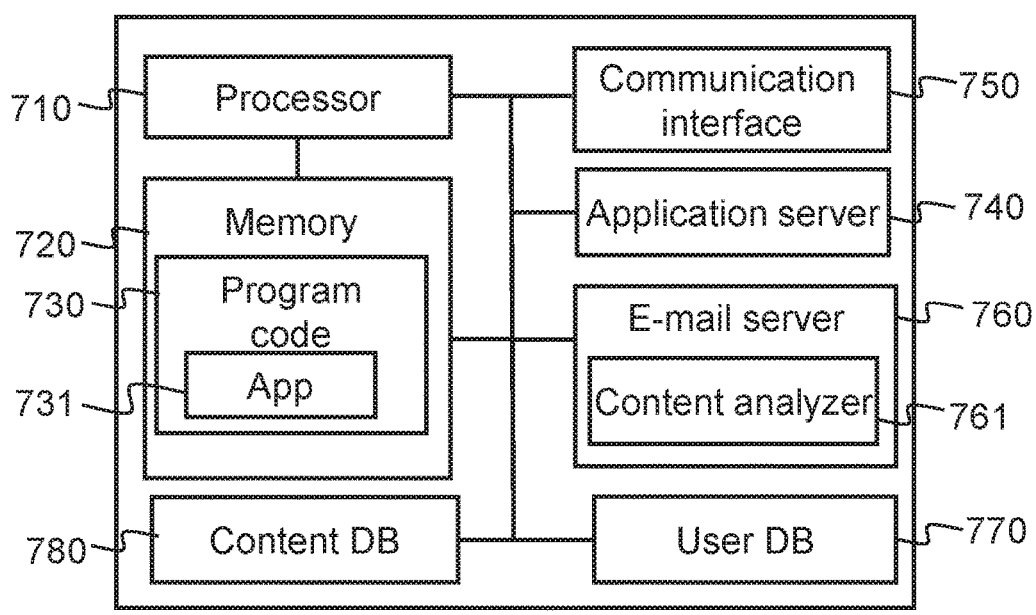
FIG. 7 presents an example block diagram of a server apparatus in which various embodiments of the invention may be applied.

FIG. 7 presents an example block diagram of a server apparatus 130 in which various embodiments of the invention may be applied.

The general structure of the server apparatus 130 comprises a processor 710, and a memory 720 coupled to the processor 710. The server apparatus 130 further comprises software 730 stored in the memory 720 and operable to be loaded into and executed in the processor 710. The software 730 may comprise one or more software modules, such as service application 731 and can be in the form of a computer program product.

The processor 710 may be, e.g., a central processing unit (CPU), a microprocessor, a digital signal processor (DSP), a graphics processing unit, or the like. FIG. 7 shows one processor 710, but the server apparatus 130 may comprise a plurality of processors.

The memory 720 may be for example a non-volatile or a volatile memory, such as a read-only memory (ROM), a programmable read-only memory (PROM), erasable programmable read-only memory (EPROM), a random-access memory (RAM), a flash memory, a data disk, an optical storage, a magnetic storage, a smart card, or the like. The server apparatus 130 may comprise a plurality of memories. The memory 720 may be constructed as a part of the server apparatus 130 or it may be inserted into a slot, port, or the like of the server apparatus 130 by a user. The memory 720 may serve the sole purpose of storing data, or it may be constructed as a part of an apparatus serving other purposes, such as processing data.

The communication interface module 750 implements at least part of radio transmission. The communication interface module 750 may comprise, e.g., a wireless or a wired interface module. The wireless interface may comprise such as a WLAN, Bluetooth, infrared (IR), radio frequency identification (RF ID), GSM/CPRS, CDMA, WCDMA, LTE (Long Term Evolution) or 5G radio module. The communication interface module 750 may be integrated into the server apparatus 130, or into an adapter, card or the like that may be inserted into a suitable slot or port of the server apparatus 130. The communication interface module 750 may support one radio interface technology or a plurality of technologies. Captured control system data associated with environmental data of the apparatus 120 or sub-system 110 may be received by the server apparatus 130 using the communication interface 750.

The e-mail server process 760, which may receive e-mail messages sent from control apparatuses 120 and remote computer apparatuses 160 via the network 150. The server 760 may comprise a content analyzer module 761, which checks if the content of the received message meets the criteria that are set for new activity data item of the service. The content analyzer module 761 may for example check whether the e-mail message contains a valid activity data item to be used. The valid data item received by the e-mail server is then sent to an application server 740, which provides application services e.g. relating to the user accounts stored in a user database 770 and content of the content management service. Content provided by the service system 100 is stored in a content database 780.

A skilled person appreciates that in addition to the elements shown in FIG. 7, the server apparatus 130 may comprise other elements, such as microphones, displays, as well as additional circuitry such as input/output (I/O) circuitry, memory chips, application-specific integrated circuits (ASIC), processing circuitry for specific purposes such as source coding/decoding circuitry, channel coding/decoding circuitry, ciphering/deciphering circuitry, and the like.

Figure 8:
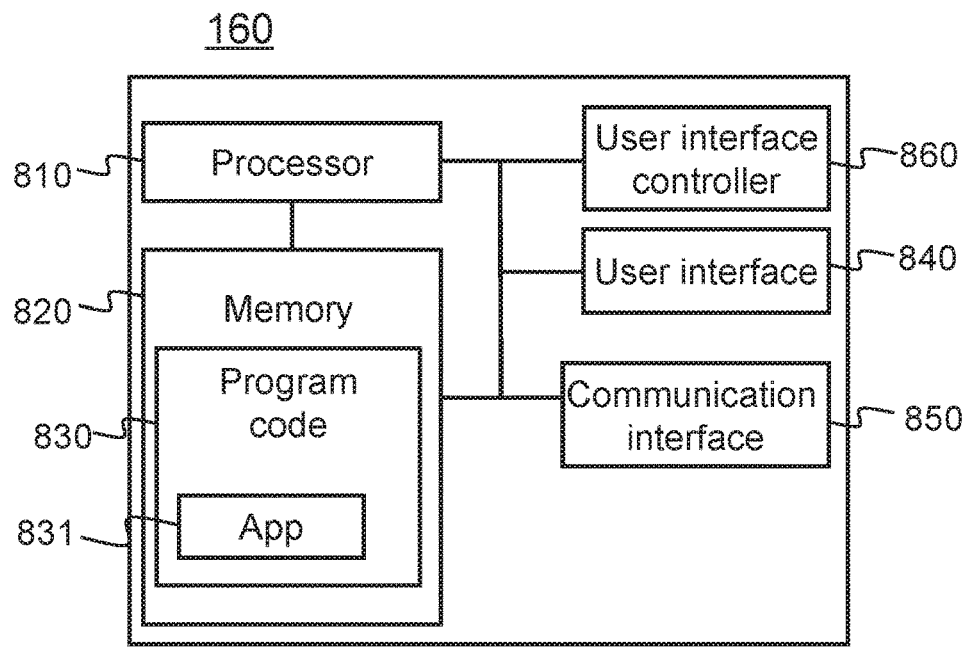
FIG. 8 presents an example block diagram of a remote computer apparatus in which various embodiments of the invention may be applied.

FIG. 8 presents an example block diagram of a remote computer apparatus 160 in which various embodiments of the invention may be applied. The computer apparatus 160 may be a user equipment (UE), user device or apparatus, such as a mobile terminal, a smart phone, a laptop computer, a desktop computer or other communication device. The computer apparatus 160 may be an RTU for SCADA interface or a remote apparatus to access EMS apparatus 120, EMS system devices 141, 142 and the subsystem 115, for example.

The general structure of the computer apparatus 160 comprises a user interface 840, a communication interface 850, a processor 810, and a memory 820 coupled to the processor 810. The computer apparatus 160 further comprises software 830 stored in the memory 820 and operable to be loaded into and executed in the processor 810. The software 830 may comprise one or more software modules, such as remote client software application 831, and can be in the form of a computer program product. The computer apparatus 160 may further comprise a user interface controller 860.

The processor 810 may be, e.g., a central processing unit (CPU), a microprocessor, a digital signal processor (DSP), a graphics processing unit, or the like. FIG. 8 shows one processor 810, but the computer apparatus 160 may comprise a plurality of processors.

The memory 820 may be for example a non-volatile or a volatile memory, such as a read-only memory (ROM), a programmable read-only memory (PROM), erasable programmable read-only memory (EPROM), a random-access memory (RAM), a flash memory, a data disk, an optical storage, a magnetic storage, a smart card, or the like. The computer apparatus 160 may comprise a plurality of memories. The memory 820 may be constructed as a part of the computer apparatus 160 or it may be inserted into a slot, port, or the like of the computer apparatus 160 by a user. The memory 820 may serve the sole purpose of storing data, or it may be constructed as a part of an apparatus serving other purposes, such as processing data.

The user interface controller 860 may comprise circuitry for receiving input from a user of the computer apparatus 160, e.g., via a keyboard, graphical user interface shown on the display of the user interfaces 840 of the computer apparatus 160, speech recognition circuitry, or an accessory device, such as a headset, and for providing output to the user via, e.g., a graphical user interface or a loudspeaker.

The communication interface module 850 implements at least part of radio transmission. The communication interface module 850 may comprise, e.g., a wireless or a wired interface module. The wireless interface may comprise such as a WLAN, Bluetooth, infrared (IR), radio frequency identification (RF ID), GSM/CPRS, CDMA, WCDMA, LTE (Long Term Evolution) radio module or 5G. The wired interface may comprise such as universal serial bus (USB) or National Marine Electronics Association (NMEA) 0183/2000 standard for example. The communication interface module 850 may be integrated into the remote computer apparatus 160, or into an adapter, card or the like that may be inserted into a suitable slot or port of the remote computer apparatus 160. The communication interface module 850 may support one radio interface technology or a plurality of technologies. The computer apparatus 160 may comprise a plurality of communication interface modules 850.

A skilled person appreciates that in addition to the elements shown in FIG. 8, the computer apparatus 160 may comprise other elements, such as microphones, extra displays, as well as additional circuitry such as input/output (I/O) circuitry, memory chips, application-specific integrated circuits (ASIC), processing circuitry for specific purposes such as source coding/decoding circuitry, channel coding/decoding circuitry, ciphering/deciphering circuitry, and the like. Additionally, the computer apparatus 160 may comprise a disposable or rechargeable battery (not shown) for powering when external power if external power supply is not available.

Figure 9:
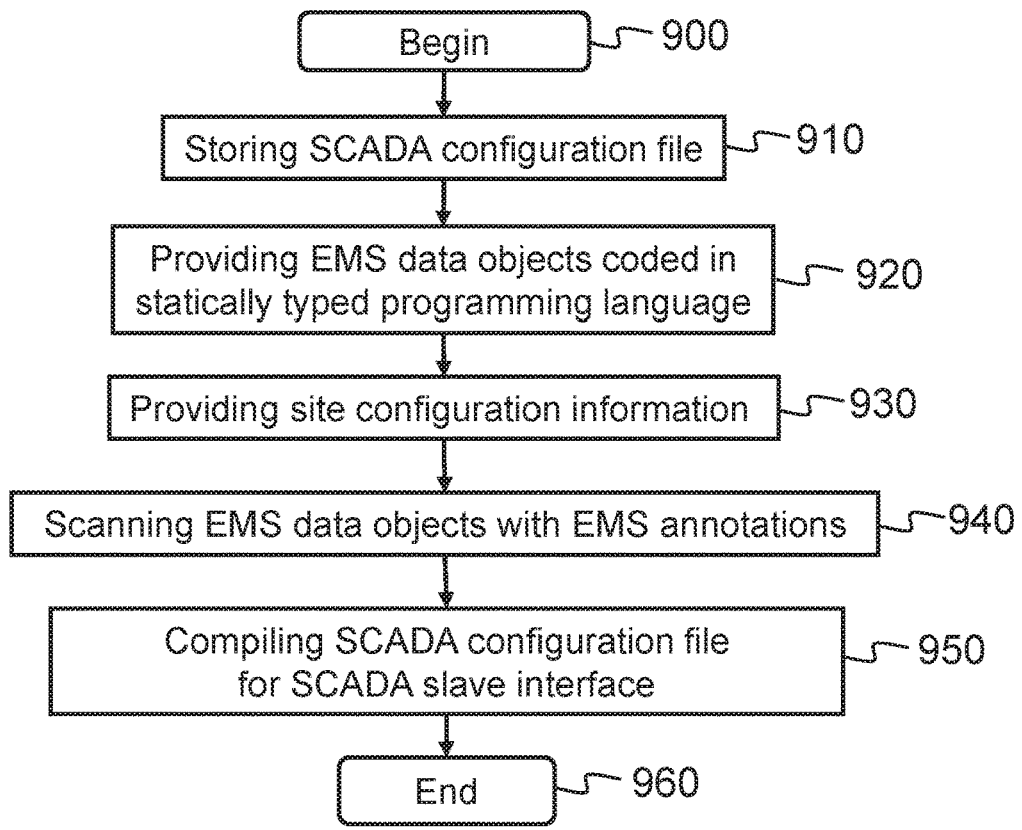
FIG. 9 shows a flow diagram showing operations in accordance with an example embodiment of the invention.

FIG. 9 shows a flow diagram showing operations in accordance with an example embodiment of the invention. In step 900, a method at an energy management system (EMS) controller apparatus for automatic generation of a SCADA (Supervisory Control And Data Acquisition) slave interface for an energy management system (EMS), is started. In step 910, a SCADA configuration file is stored, the configuration file including a point map mapping SCADA data points to EMS data objects, wherein the point map is configured to define the EMS data objects accessible via the SCADA slave interface using the SCADA data points. In step 920, the EMS data objects coded in statically typed programming language are provided, wherein each EMS data object comprises entity properties associated using EMS annotations. In step 930, site configuration information of the energy management system (EMS) is provided. In step 940, EMS data objects with EMS annotations are scanned by an object access framework (OAF), and they are combined with the site configuration information to generate an object binding repository (OBR). In step 950, the SCADA configuration file is compiled, by a SCADA binding framework, to combine the SCADA data points mapping with the object binding repository (OBR) to generate communication protocol specific SCADA bindings information configured to form a part of the SCADA slave interface for the energy management system (EMS). The method is ended in step 960.

Without in any way limiting the scope, interpretation, or application of the claims appearing below, a technical effect of one or more of the example embodiments disclosed herein is an improved system for a power plant control.

A technical effect of one or more of the example embodiments disclosed herein is that reliability of the control system is improved.

A further technical effect of one or more of the example embodiments disclosed herein is that accuracy of control data is improved.

Another technical effect of one or more of the example embodiments disclosed herein is that coding time is saved. The developer does not need to conduct any custom coding to create SCADA server that meets customer data SCADA data interface requirements. He only needs to create a configuration file per data requirement.

Another technical effect of one or more of the example embodiments disclosed herein is that consistency is improved. Same OAF framework and Object Binding Repository can be used by other external interfaces such as HMI and Web Services. Data consistency is thus provided across all interfaces.

Another technical effect of one or more of the example embodiments disclosed herein is that flexibility is improved. SCADA interface can be modified by simply changing SCADA configuration file without any code change.

Another technical effect of one or more of the example embodiments disclosed herein is that wider variety of devices and manufacturers may be used.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the foregoing describes example embodiments of the invention, these descriptions should not be viewed in a limiting sense. Rather, there are several variations and modifications that may be made without departing from the scope of the present invention as defined in the appended claims.

The invention claimed is:

1. A computer implemented method at an energy management system (EMS) controller apparatus for automatic generation of a SCADA (Supervisory Control And Data Acquisition) slave interface for an energy management system (EMS), comprising:

storing a SCADA configuration file, the SCADA configuration file including a point map mapping SCADA data points to EMS data objects, wherein the point map is configured to define the EMS data objects accessible via the SCADA slave interface using the SCADA data points;

providing the EMS data objects coded in statically typed programming language, wherein each EMS data object comprises entity properties associated using EMS annotations;

providing site configuration information of the energy management system (EMS);

scanning, by an object access framework (OAF), EMS data objects with EMS annotations and combining them with the site configuration information to generate an object binding repository (OBR); and compiling, by a SCADA binding framework, the SCADA configuration file to combine the SCADA data points mapping with the object binding repository (OBR) to generate communication protocol specific SCADA bindings information configured to form a part of the SCADA slave interface for the energy management system (EMS).

2. The method of claim 1, further comprising:

receiving a data request from a SCADA client at the SCADA slave interface;

determining, by an EMS SCADA protocol library layer, a SCADA protocol of the data request;

generating a service call to a points bridge layer in response to the determined SCADA protocol; and converting the service call to an EMS data object call for a SCADA bindings layer.

3. The method of claim 2, further comprising:

connecting the EMS data object call, by the SCADA bindings layer, to at least one method call to an executable EMS data object coded in a statically typed programming language.

4. The method of claim 3, wherein the executable EMS data object call is connected via an object access framework (OAF) layer to an EMS object layer.

5. The method of claim 3, wherein the EMS data object call is connected to at least one EMS device or EMS service of the EMS object layer.

6. The method of claim 4, wherein the object access framework (OAF) layer is configured to provide binding and metadata.

7. The method of claim 1, wherein the EMS data object comprises at least one of the following:

an energy resource equipment;
an energy storage system (ESS);
a measurement device;
a software logic status; and
an operation setpoint.

8. The method of claim 1, wherein the SCADA data point comprises at least one of the following received information:

equipment status data;
state of charge (SOC) of an energy storage system;
measurement readings;
real power or reactive power status information;
temperature information; and
fault status information.

9. The method of claim 1, wherein the SCADA data point comprises at least one of the following transmitted information:

start command;
stop command;

reset command; and update setpoint command.

10. The method of claim 1, wherein the SCADA slave interface is configured to operate using at least one of the following protocols;

DNP3; and

Modbus.

11. The method of claim 10, wherein the SCADA data point is configured to comprise:

a register in Modbus; or a point or an object in DNP3.

12. The method of claim 1, wherein the EMS annotations comprising at least one of the following:

indication which EMS data objects are part of public API; and metadata.

13. The method of claim 12, wherein the metadata comprising at least one of the following:

units of measurement; and human-readable descriptions.

14. The method of claim 1, wherein the SCADA configuration file comprises at least one of the following protocol information:

data type used;

encoding information; and point positions and their mapping to physical EMS device properties.

15. The method of claim 1, wherein the SCADA slave interface for an energy management system (EMS) comprising at least one of:

a first slave interface for a remote terminal unit (RTU) for controlling the EMS; and a second slave interface for a local access for status monitoring and support.

16. The method of claim 15, wherein at the energy management system (EMS) controller apparatus, a HTTPS Web based human-machine interface is configured to control the EMS system remotely using Web browsers.

17. A controller apparatus for an energy management system (EMS) for automatic generation of SCADA slave interface, the controller apparatus comprising:

a communication interface configured to transceive information with a SCADA client and EMS data objects;

at least one processor; and at least one memory including computer program code;

the at least one memory and the computer program code configured to, with the at least one processor, cause the apparatus to:

store a SCADA configuration file, the configuration file including a point map mapping SCADA data points to EMS data objects, wherein the point map is configured to define the EMS data objects accessible via the SCADA slave interface using the SCADA data points;

provide the EMS data objects coded in statically typed programming language, wherein each EMS data object comprises entity properties associated using EMS annotations;

provide site configuration information of the energy management system (EMS);

scan, by an object access framework (OAF), EMS data objects with EMS annotations and combining them with the site configuration information to generate an object binding repository (OBR); and compile, by a SCADA binding framework, the SCADA configuration file to combine the SCADA data points mapping with the object binding repository (OBR) to generate SCADA bindings information configured to form a part of the SCADA slave interface for the energy management system (EMS).

18. A computer program embodied on a computer readable non-transitory medium comprising computer executable program code, which code, when executed by at least one processor of an apparatus, causes the apparatus to:

store a SCADA configuration file, the configuration file including a point map mapping SCADA data points to EMS data objects, wherein the point map is configured to define the EMS data objects accessible via the SCADA slave interface using the SCADA data points;

provide the EMS data objects coded in statically typed programming language, wherein each EMS data object comprises entity properties associated using EMS annotations;

provide site configuration information of the energy management system (EMS);

scan, by an object access framework (OAF), EMS data objects with EMS annotations and combining them with the site configuration information to generate an object binding repository (OBR); and compile, by a SCADA binding framework, the SCADA configuration file to combine the SCADA data points mapping with the object binding repository (OBR) to generate SCADA bindings information configured to form a part of the SCADA slave interface for the energy management system (EMS).

* * * * *